(12) United States Patent
Takahashi

(10) Patent No.: US 10,283,178 B2
(45) Date of Patent: May 7, 2019

(54) SEMICONDUCTOR DEVICE

(71) Applicant: RENESAS ELECTRONICS CORPORATION, Tokyo (JP)

(72) Inventor: Hiroyuki Takahashi, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/706,280

(22) Filed: Sep. 15, 2017

(65) Prior Publication Data
US 2018/0090193 A1 Mar. 29, 2018

(30) Foreign Application Priority Data

Sep. 28, 2016 (JP) .................................. 2016-189280

(51) Int. Cl.
| | |
|---|---|
| G11C 5/06 | (2006.01) |
| G11C 5/02 | (2006.01) |
| G11C 8/12 | (2006.01) |
| H01L 25/065 | (2006.01) |
| G11C 7/10 | (2006.01) |
| H01L 23/528 | (2006.01) |

(52) U.S. Cl.
CPC ............... *G11C 8/12* (2013.01); *G11C 5/025* (2013.01); *G11C 5/063* (2013.01); *H01L 25/0657* (2013.01); *G11C 7/1051* (2013.01); *G11C 7/1078* (2013.01); *H01L 23/528* (2013.01); *H01L 2225/06513* (2013.01); *H01L 2225/06541* (2013.01)

(58) Field of Classification Search
CPC .. G11C 8/12; G11C 5/02; G11C 5/063; G11C 7/1051; G11C 7/1078; H01L 25/0657; H01L 23/528

USPC ....................................................... 365/63, 51
See application file for complete search history.

(56) References Cited

U.S. PATENT DOCUMENTS

| | | | |
|---|---|---|---|
| 7,982,504 B1* | 7/2011 | Robinett | ......... H01L 21/823871 326/101 |
| 8,159,265 B1* | 4/2012 | Madurawe | ....... H03K 19/17732 326/38 |

(Continued)

FOREIGN PATENT DOCUMENTS

JP            5654855 B2     1/2015

*Primary Examiner* — Viet Q Nguyen
(74) *Attorney, Agent, or Firm* — McDermott Will & Emery LLP

(57) ABSTRACT

A semiconductor device which reduces power consumption. In the semiconductor device, semiconductor chips are stacked over a base chip. The stacked chips include n through-silicon vias as a first group and m through-silicon vias as a second group. In each of the first and second groups, the through-silicon vias are coupled by a shift circular method, in which the 1st to (n−1)th ((m−1)th) through-silicon vias of a lower chip are coupled with the 2nd to n-th (m-th) through-silicon vias of an upper chip respectively and the n-th (m-th) through-silicon via of the lower chip is coupled with the 1st through-silicon via of the upper chip. n and m have only one common divisor. Activation of the stacked semiconductor chips is controlled by combination of a first selection signal transmitted through through-silicon vias of the first group and a second selection signal transmitted through through-silicon vias of the second group.

6 Claims, 13 Drawing Sheets

(56) References Cited

U.S. PATENT DOCUMENTS

| | | | |
|---|---|---|---|
| 8,253,443 B2* | 8/2012 | Robinett | H01L 45/04 |
| | | | 326/101 |
| 8,565,003 B2* | 10/2013 | Siau | G11C 11/5685 |
| | | | 365/148 |
| 8,924,903 B2 | 12/2014 | Ide | |
| 9,147,438 B2* | 9/2015 | Kamal | G06F 1/3225 |
| 9,251,860 B2* | 2/2016 | Yip | G11C 16/02 |
| 9,558,791 B2* | 1/2017 | Huang | G11C 5/025 |
| 9,679,634 B2* | 6/2017 | Takahashi | H01L 27/10814 |
| 9,941,287 B2* | 4/2018 | Huang | G11C 5/025 |
| 10,044,355 B2* | 8/2018 | Bai | H03K 19/1736 |
| 2006/0233012 A1* | 10/2006 | Sekiguchi | G11C 5/02 |
| | | | 365/51 |
| 2009/0039492 A1* | 2/2009 | Kang | G11C 5/02 |
| | | | 257/686 |
| 2011/0087811 A1* | 4/2011 | Kondo | G06F 1/12 |
| | | | 710/71 |
| 2012/0059984 A1* | 3/2012 | Kang | H01L 25/18 |
| | | | 711/106 |
| 2012/0134193 A1* | 5/2012 | Ide | H01L 23/481 |
| | | | 365/51 |
| 2013/0023106 A1* | 1/2013 | Pickett | G11C 13/0002 |
| | | | 438/382 |
| 2013/0121092 A1* | 5/2013 | Ogasawara | G11C 7/00 |
| | | | 365/189.15 |
| 2014/0077391 A1* | 3/2014 | Kikuchi | H01L 23/49827 |
| | | | 257/774 |
| 2017/0018541 A1* | 1/2017 | Yi | H01L 25/18 |
| 2017/0125092 A1* | 5/2017 | Hirashima | G11C 13/004 |
| 2017/0194039 A1* | 7/2017 | Funaki | G11C 5/02 |
| 2018/0122773 A1* | 5/2018 | Nagai | H01L 25/0657 |

* cited by examiner

FIG. 5

| | BANK SELECTION SIGNAL | | | | CHIP SELECTION SIGNAL | | | | |
|---|---|---|---|---|---|---|---|---|---|
| | BP10 | BP11 | BP12 | BP13 | BP20 | BP21 | BP22 | BP23 | BP24 |
| MD0  | ○ | — | — | — | ○ | — | — | — | — |
| MD1  | — | ○ | — | — | — | ○ | — | — | — |
| MD2  | — | — | ○ | — | — | — | ○ | — | — |
| MD3  | — | — | — | ○ | — | — | — | ○ | — |
| MD4  | ○ | — | — | — | — | — | — | — | ○ |
| MD5  | — | ○ | — | — | ○ | — | — | — | — |
| MD6  | — | — | ○ | — | — | ○ | — | — | — |
| MD7  | — | — | — | ○ | — | — | ○ | — | — |
| MD8  | ○ | — | — | — | — | — | — | ○ | — |
| MD9  | — | ○ | — | — | — | — | — | — | ○ |
| MD10 | — | — | ○ | — | ○ | — | — | — | — |
| MD11 | — | — | — | ○ | — | ○ | — | — | — |
| MD12 | ○ | — | — | — | — | — | ○ | — | — |
| MD13 | — | ○ | — | — | — | — | — | ○ | — |
| MD14 | — | — | ○ | — | — | — | — | — | ○ |
| MD15 | — | — | — | ○ | ○ | — | — | — | — |

SEMICONDUCTOR DEVICE

CROSS-REFERENCE TO RELATED APPLICATIONS

The disclosure of Japanese Patent Application No. 2016-189280 filed on Sep. 28, 2016 including the specification, drawings and abstract is incorporated herein by reference in its entirety.

BACKGROUND

The present invention relates to semiconductor devices and more particularly to semiconductor chips used in a semiconductor device in which a plurality of semiconductor chips are stacked.

In the recent years, multilayer semiconductor devices have been proposed in which stacked semiconductor chips are placed in one package and the stacked semiconductor chips are coupled through through-silicon vias penetrating semiconductor substrates. An example of such a multilayer semiconductor device is disclosed in the publication of Japanese Patent No. 5654855.

The semiconductor device described in the publication of Japanese Patent No. 5654855 includes a plurality of memory chips which are stacked, in which each of the memory chips includes a plurality of memory banks, a plurality of read/write buses allocated to the memory banks respectively, and a plurality of through-silicon vias allocated to the read/write buses respectively, penetrating the memory chip. Regarding the through-silicon vias of the memory chips, several through-silicon vias located at the same position as seen in the stacking direction are commonly coupled among the memory chips and in response to a request for access, the memory chips each simultaneously activate memory banks located at different positions as seen in the stacking direction so that input and output of data are performed simultaneously through the through-silicon vias located at different positions as seen in the stacking direction.

SUMMARY

In a multilayer semiconductor device, a drive circuit formed over each chip sends and receives a signal between semiconductor chips by driving the parasitic capacitance inherent in a signal pathway in the stacking direction. For this reason, in the multilayer semiconductor device, the drive capability of the drive circuit and the operation speed of the semiconductor device are determined depending on the magnitude of parasitic capacitance inherent in the signal pathway in the stacking direction. In other words, in order to improve various performance aspects of the multilayer semiconductor device, such as power consumption and operation speed, the parasitic capacitance inherent in the signal pathway in the stacking direction must be reduced. The above and further objects and novel features of the invention will more fully appear from the following detailed description in this specification and the accompanying drawings.

According to one aspect of the invention, there is provided a semiconductor device with semiconductor chips stacked over a base chip, in which the stacked chips include n through-silicon vias as a first group and m through-silicon vias as a second group. The n through-silicon vias of the first group are coupled by a shift circular method in which the 1st to (n−1)th through-silicon vias of a lower chip are coupled with the 2nd to n-th through-silicon vias of an upper chip respectively and the n-th through-silicon via of the lower chip is coupled with the 1st through-silicon via of the upper chip, and the m through-silicon vias of the second group are coupled by the shift circular method in which the 1st to (m−1)th through-silicon vias of the lower chip are coupled with the 2nd to m-th through-silicon vias of the upper chip respectively and the m-th through-silicon via of the lower chip is coupled with the 1st through-silicon via of the upper chip. n and m are set to have only one common divisor. Activation of the stacked semiconductor chips is controlled by combination of a first selection signal transmitted through through-silicon vias of the first group and a second selection signal transmitted through through-silicon vias of the second group.

According to the present invention, the semiconductor device can reduce the parasitic capacitance inherent in a signal pathway formed in the stacking direction of semiconductor chips.

BRIEF DESCRIPTION OF THE DRAWINGS

FIG. 5 is a table which explains how to select the chip to be activated in the semiconductor device according to the first embodiment;

DETAILED DESCRIPTION

Figure 1:
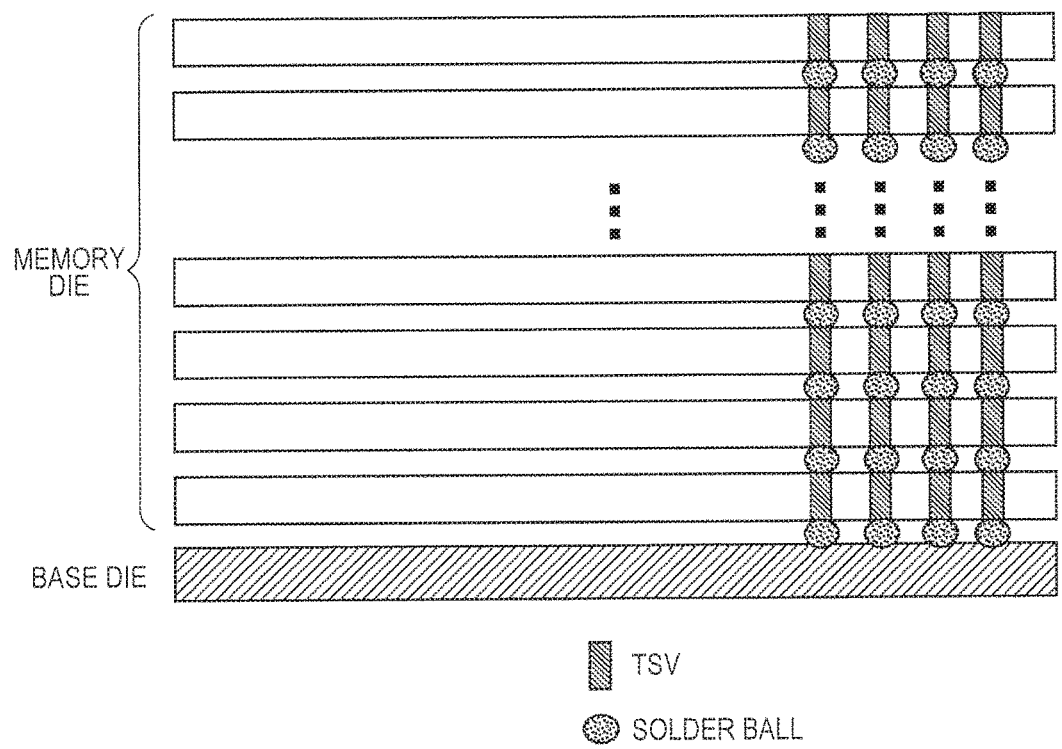
FIG. 1 is a view which explains the stacked chips of a semiconductor device according to a first embodiment of the invention.

In order to make the explanation clear, the following descriptions and drawings are given in simplified or schematic form as appropriate. In the drawings, the same elements are designated by the same reference signs and repeated description of the same elements is omitted as necessary.

First Embodiment

In the semiconductor device according to the first embodiment, a plurality of semiconductor chips are stacked and the stacked semiconductor chips are coupled through through-silicon vias formed in a manner to penetrate semiconductor substrates. The stacked semiconductor chips may include a functional circuit chip for performing a given process, a processing circuit chip for executing a program (for example, a CPU core chip) and a memory chip. In the semiconductor device according to the first embodiment, the base chip located at the lowest position uses the functions of semiconductor chips stacked over it. In the explanation given below, it is assumed that the base chip is a CPU core chip and the semiconductor chips stacked over it are memory chips. What kind of functions the base chip and the stacked semiconductor chips have is not limited to the example explained below.

A memory chip includes, as an internal functional circuit, a memory circuit including a memory element and a control circuit for performing concrete reading and writing processes for the memory element. The CPU core chip includes a CPU core circuit for arithmetic processing as an internal functional circuit, and an interface circuit for external interfacing. The semiconductor device according to the first embodiment uses a plurality of memory chips in order to provide a large memory capacity, in which the memory region formed by a plurality of memory chips is divided into a plurality of memory spaces and one of the memory spaces is allocated to each of the memory chips. The explanation below gives an example in which each of the memory spaces as divisions of the memory is treated as a bank. However, instead each memory space as a division of the memory may not be treated as a bank.

FIG. 1 is a view which explains the stacked chips of the semiconductor device according to the first embodiment. In the semiconductor device according to the first embodiment shown in FIG. 1, a plurality of memory chips are stacked over a base chip. As shown in FIG. 1, through-silicon vias TSV are provided in the memory chips in a manner to penetrate the semiconductor substrates. The through-silicon vias are located at the same position as seen in the stacking direction. In the semiconductor device according to the first embodiment, the base chip and the through-silicon vias TSV of the lowest memory chip are electrically coupled by solder balls and the through-silicon vias TSV of each die and the through-silicon vias TSV of another chip are electrically coupled by solder balls.

One feature of the semiconductor device according to the first embodiment is a pathway which transmits the signal to be transmitted through a through-silicon via of a memory chip located in a lower layer, to a memory chip located in an upper layer. In the semiconductor device according to the first embodiment, the lower pads, upper pads and internal wiring of a memory chip configure a signal transmission pathway. A lower pad is formed in the memory chip in a manner to contact a through-silicon via of the semiconductor substrate. An upper pad, which is formed in the memory chip and located in a higher layer than the lower pad, serves as a terminal for coupling with a through-silicon via of the memory chip located in the higher layer. The internal wiring couples the lower pads and the upper pads and also couples the lower pads and the internal circuit of the memory chip.

Figure 2:
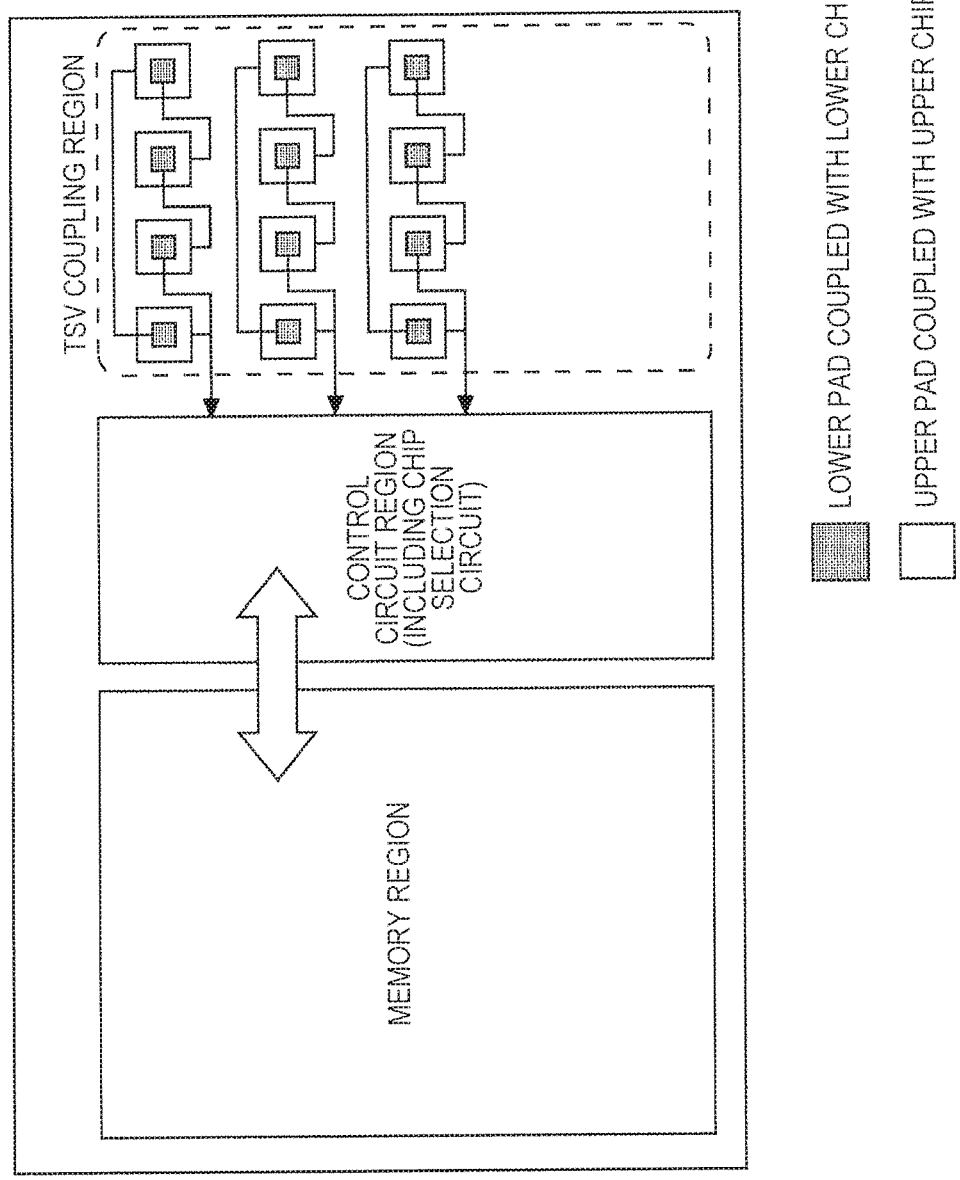
FIG. 2 is a block diagram which explains the configuration of a memory chip according to the first embodiment.

FIG. 2 is a block diagram which explains the configuration of a memory chip according to the first embodiment. As shown in FIG. 2, the memory chip according to the first embodiment includes a memory region, a control circuit region, and a TSV coupling region. The memory region is a region in which a plurality of memory elements for storing data are formed and the control circuit region includes a read/write circuit for writing data to, and reading data from, the memory elements of the memory region. The control circuit region includes a chip selection circuit which activates the function of the chip as a memory chip by giving an activation command to the read/write circuit, etc. when the chip is selected.

In the TSV coupling region, through-silicon vias, upper pads, and lower pads are formed. The through-silicon vias penetrate the semiconductor substrate from the back surface of the semiconductor substrate where no circuit is formed, to the front surface of the semiconductor substrate where a circuit is formed, and contact the lower pads on the front surface of the semiconductor substrate. Since the through-silicon vias are located under the lower pads and thus invisible, the through-silicon vias are not shown in FIG. 2. In the semiconductor device according to the first embodiment, a pair of pads, namely an upper pad and a lower pad, are provided for one through-silicon via. The through-silicon via, upper pad, and lower pad which correspond to one another are at the same position in the thickness direction of the semiconductor chip. Although FIG. 2 shows an example that the upper pad is smaller than the lower pad, instead the size of the upper pad may be equal to the size of the lower pad or the lower pad may be smaller than the upper pad.

In the semiconductor device according to the first embodiment, the through-silicon vias are divided into two or more groups. In as many stacked chips as through-silicon vias belonging to one group, the upper pads and lower pads in each chip are coupled by internal wiring so that the through-silicon vias in the same group are coupled by a shift circular method. In the example shown in FIG. 2, four through-silicon vias belong to one group. Specifically, when the through-silicon vias belonging to one group are numbered from 1 to n, the lower pads corresponding to the 1st to (n−1)th through-silicon vias are coupled with the upper pads corresponding to the 2nd to n-th through-silicon vias respectively and the lower pad corresponding to the n-th through-silicon via is coupled with the upper pad corresponding to the 1st through-silicon via by the internal wiring. Since the upper pads and lower pads in each memory chip are coupled by internal wiring in this way, if n memory chips are stacked, a signal which has entered one through-silicon via passes through all of the 1st to n-th through-silicon vias while the signal is transmitted to the n memory chips. The same signal transmission pathway can be formed in every n memory chips. In this coupling method, the same signal transmission pathway can be repeatedly formed in every n memory chips and the signal passes through all of the 1st to n-th through-silicon vias while the signal is transmitted to the n memory chips. Hereinafter, the method for coupling through-silicon vias to form a signal pathway in this way is called "shift circular coupling".

In the semiconductor device according to the first embodiment, only one of through-silicon vias belonging to one group is coupled with the internal circuit in the memory chip. In the example shown in FIG. 2, only the signal that is transmitted through the 1st through-silicon via is transmitted to the circuit formed in the control circuit region of the memory chip.

Figure 3:
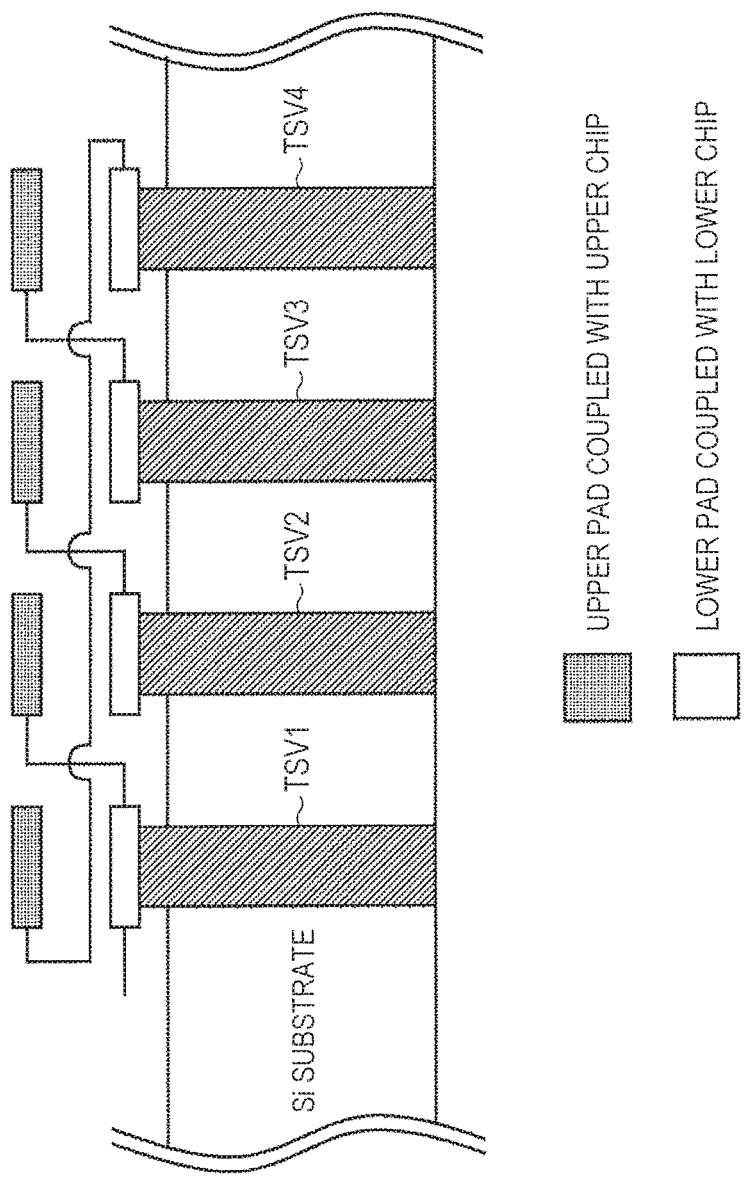
FIG. 3 is a sectional view of a memory chip which explains how through-silicon vias are coupled with pads in the memory chip according to the first embodiment.

Next, the through-silicon vias in a group and the corresponding upper and lower pads will be described referring to a sectional view of the TSV region. FIG. 3 is a sectional view of a memory chip which explains how through-silicon vias are coupled with pads in the memory chip according to the first embodiment. In the example shown in FIG. 3, four through-silicon vias configure one group, and the figure shows only the four through-silicon vias and related parts.

As shown in FIG. 3, in the semiconductor device according to the first embodiment, through-silicon vias TSV1 to TSV4 are formed in a manner to penetrate the semiconductor substrate. A lower pad is formed at the end of each of the through-silicon vias TSV1 to TSV4 on the chip front surface side. When the memory chip is viewed from above, an upper pad is formed at the same position as a lower pad. The upper pad is located in a higher layer than the lower pad.

As shown in FIG. 3, the lower pads corresponding to the through-silicon vias TSV1 to TSV3 are coupled with the upper pads corresponding to the through-silicon vias TSV2 to TSV4 by internal wiring. The lower pad corresponding to the through-silicon via TSV4 is coupled with the upper pad corresponding to the through-silicon via TSV1 by internal wiring. A signal which has entered the through-silicon via TSV1 is sent to the internal circuit of the memory chip by internal wiring.

Figure 4:
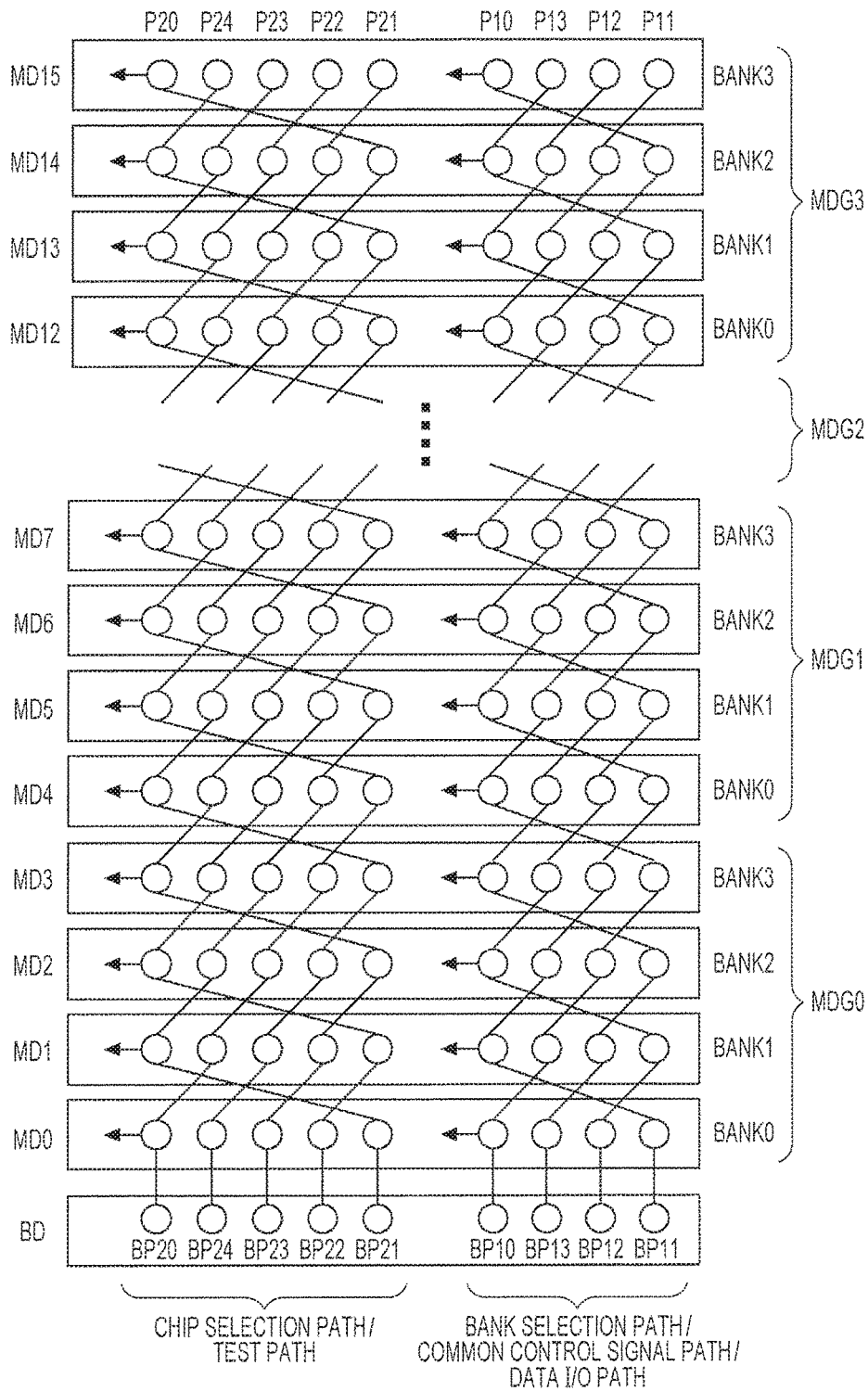
FIG. 4 is a view which explains signal pathways in the semiconductor device according to the first embodiment.

Next, an explanation will be given of a signal pathway according to the first embodiment in which a plurality of memory chips are stacked over the base chip. FIG. 4 is a view which explains signal pathways in the semiconductor device according to the first embodiment.

As shown in FIG. 4, in the semiconductor device according to the first embodiment, a plurality of memory chips (for example, memory chips MD0 to MD15) are stacked over the base chip BD. A signal from the base chip is given to the memory chips MD0 to MD15 through through-silicon vias. Furthermore, in the semiconductor device according to the first embodiment, one of memory spaces (for example, memory banks 0 to 3) obtained by dividing the entire memory region formed by the memory chips MD0 to MD15 for every given capacity is allocated to each of the memory chips MD0 to MD15. In the semiconductor device according to the first embodiment, memory die groups MDG0 to MDG3 are defined so as to each include banks 0 to 3. In other words, one memory die group includes four memory chips.

In the semiconductor device according to the first embodiment, a bank selection path, common control path, and data IO path which mainly transmit bank-related data signals and control signals (hereinafter called bank access paths) are defined as a first group of through-silicon vias. Also, a die selection path and test path which mainly give signals to each memory chip (hereinafter called chip access paths) are defined as a second group of through-silicon vias. Then, the number of first through-silicon vias of the first group is expressed by n (n is an integer which indicates the number of first through-silicon vias) and the number of second through-silicon vias of the second group is expressed by m (m is an integer which indicates the number of second through-silicon vias). Then, n and m are set to values which have only one common divisor. In the example shown in FIG. 4, n is 4 and m is 5. Also, n is the same as the number of banks. Since the number of through-silicon vias in the first group is the same as the number of banks in one memory die group like this, memory control for each bank can be made easily using the first group.

In the example shown in FIG. 4, ports BP10 to BP13 are provided at terminals on the base chip for input/output of signals through first through-silicon vias of the first group and ports BP20 to BP24 are provided on terminals over the base chip for input/output of signals through second through-silicon vias of the second group. Also, ports P10 to P13 are provided at terminals on memory chips for transmission of signals through first through-silicon vias of the first group and ports P20 to P24 are provided on terminals over memory chips for transmission of signals through second through-silicon vias of the second group. The memory chips receive and send signals through the port P10 and the port P20.

In the semiconductor device according to the first embodiment, the memory chips stacked over the base chip each have upper pads, lower pads, and internal wirings as illustrated in FIGS. 2 and 3. In the semiconductor device according to the first embodiment, these memory chips are stacked in a manner that the through-silicon vias of the first group are shift-circular-coupled in each memory die group and the through-silicon vias of the second group are shift-circular-coupled in every five memory chips.

Since the signal pathways among memory chips are as shown in FIG. 4, a specific chip can be selected using two signals, namely a first selection signal (for example, a bank selection signal) and a second selection signal (for example, a chip selection signal). FIG. 5 is a table which explains how to select the chip to be activated in the semiconductor device according to the first embodiment.

As shown in FIG. 5, in the semiconductor device according to the first embodiment, only one combination of a port on the base chip for output of a bank selection signal and a port on the base chip for output of a chip selection signal is used to activate a chip. For example, the memory chip MD4 is selected by output of a bank selection signal from the port BP10 and output of a chip selection signal from the port BP24.

As mentioned above, in the semiconductor device according to the first embodiment, a specific bank located in a specific chip is selected by combination of a first selection signal (for example, a bank selection signal) and a second selection signal (for example, a chip selection signal) which are sent from the base chip. Next, the circuit configuration related to memory access in the base chip and a memory chip will be described.

Figure 6:
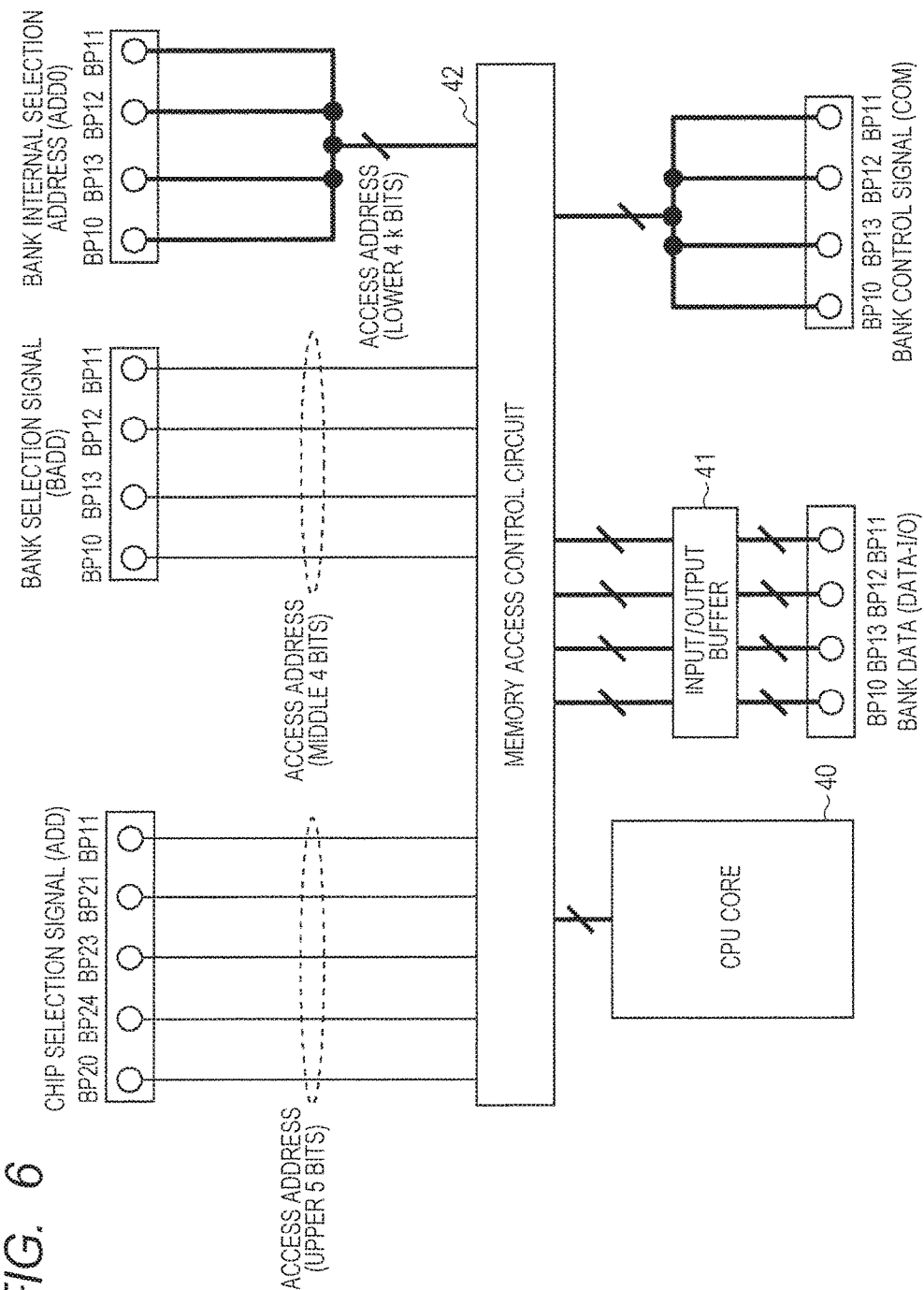
FIG. 6 is a block diagram of the base chip of the semiconductor device according to the first embodiment.

FIG. 6 is a block diagram of the base chip of the semiconductor device according to the first embodiment. As shown in FIG. 6, the semiconductor device according to the first embodiment includes a CPU core 40, an input/output buffer 41, and a memory access control circuit 42. Furthermore, the semiconductor device according to the first embodiment is provided with a plurality of ports for the memory to receive and send a signal. Among these ports, only ports that correspond to through-silicon vias of stacked memory chips are shown in FIG. 6.

The CPU core 40 is an arithmetic circuit which processes various data using the stacked memory chips as storage regions. The input/output buffer 41 is a circuit which outputs bank data given from the CPU core 40 through the memory access control circuit 42 to a memory chip and also gives bank data read from a memory chip through the memory access control circuit 42 to the CPU core 40. It includes a plurality of input/output buffer circuits. The memory access control circuit 42 generates a specific operation command and address information to be given to the memory chip, from an access command given by the CPU core 40, and gives the generated operation command and address information to the memory chip. Specifically, the memory access control circuit 42 outputs, as an operation command, an activation command indicating the number of the bank to be activated and outputs, as a bank control signal, a signal containing an operation command to indicate the type of operation such as read operation or write operation. Furthermore, the memory access control circuit 42 outputs the address information on the memory element to be accessed. The upper five bits of this address information are used for a chip selection signal, its middle four bits are used for a bank selection signal, and its lower k bits are used for a bank internal selection address which indicates a memory address in the selected bank.

As shown in FIG. 6, in the base chip according to the first embodiment, a plurality of ports are grouped according to the type of output signal. More specifically, for a bank selection signal, bank internal selection address, bank control signal, and bank data, signals are sent and received through first through-silicon vias of the first group in which n through-silicon vias (for example, n=4) are shift-circular-coupled and thus the number of ports for input/output of these signals on the base chip is the same as the number of through-silicon vias of the first group. A chip selection signal is sent and received through second through-silicon vias of the second group in which m through-silicon vias (for example, m=4) are shift-circular-coupled and thus the number of ports for input/output of a chip selection signal on the base chip is the same as the number of through-silicon vias of the second group.

For a chip selection signal and a bank selection signal, one port is used for input and output of one bit and thus the input/output ports for these signals each have one terminal. On the other hand, for a bank internal selection address, bank control signal, and bank data, one port is used for input and output of multiple bits and thus the input/output ports for these signals each have a plurality of terminals. In order to clarify only the number of ports, FIG. 6 shows ports regardless of how many terminals each port has. Although FIG. 6 shows the CPU core 40 as one of the internal circuits, instead the CPU core 40 may be located on another chip. If that is the case, the input/output buffer 41, memory access control circuit 42, and related ports are formed on the base chip according to the first embodiment.

Figure 7:
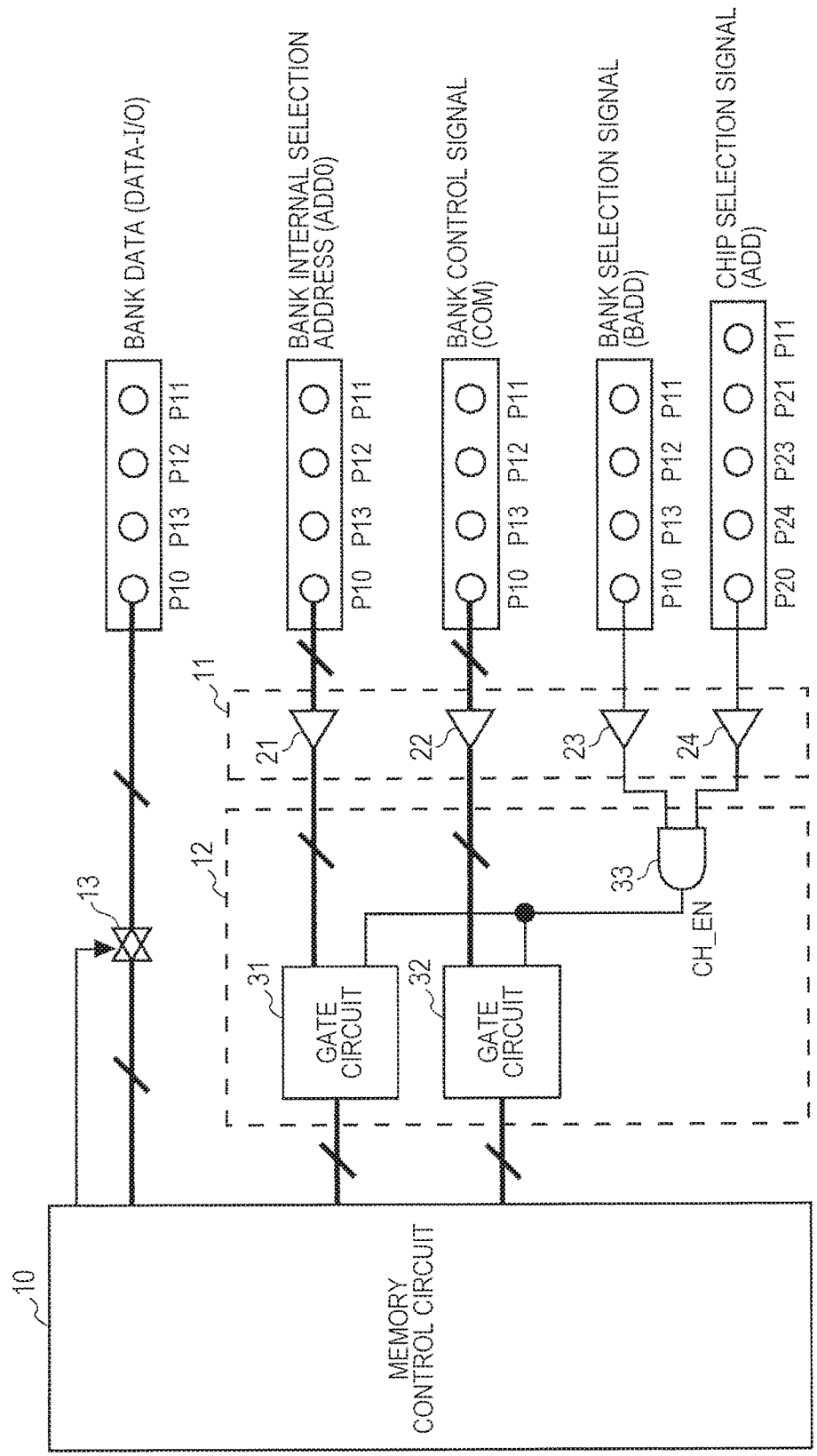
FIG. 7 is a block diagram which explains the chip selection circuit of the memory chip in the semiconductor device according to the first embodiment.

Next, a chip selection circuit formed on a memory chip will be described. FIG. 7 is a block diagram which explains a chip selection circuit in the semiconductor device according to the first embodiment. Among the circuits of the memory chip, FIG. 7 shows a memory control circuit 10, a buffer circuit group 11, a chip selection circuit 12, an input/output buffer 13, and through-silicon vias related to these circuits. In FIG. 7, through-silicon vias are shown on a one-via-per-port basis, but actually a port to which a multi-bit signal is transmitted has a plurality of through-silicon vias.

In the example shown in FIG. 7, the bank data, bank internal selection address, bank control signal, and bank selection signal are given to the memory chip through the through-silicon vias of the first group which are coupled by the abovementioned method and the chip selection signal is given to the memory chip through the through-silicon vias of the second group which are coupled by the abovementioned method.

In the example shown in FIG. 7, the buffer circuit group 11 transmits signals given through through-silicon vias, to the chip selection circuit 12. The buffer circuit group 11 includes buffer circuits 21 to 24 which are intended for the signals to be transmitted. The chip selection circuit 12 includes gate circuits 31 and 32, and an AND circuit 33. The AND circuit 33 outputs a chip enable signal CH_EN which is high when the bank selection signal and chip selection signal are both enabled (for example, high). The gate circuit 31 outputs a bank internal selection address to the memory control circuit 10 in a period when the chip enable signal CH_EN is high. The gate circuit 32 outputs a bank control signal to the memory control circuit 10 in a period when the chip enable signal CH_EN is high. Here, the bank internal selection address is an address which indicates the location at which the bank data as the object of operation is stored in the memory chip. The bank control signal is an operation command to the memory and for example, it may be a command such as a read command or write command.

If the command to the memory chip is a write command, the input/output buffer 13 transmits the write data to the memory chip for input to the chip. If the command to the memory chip is a read command, the input/output buffer 13 outputs the read data read from the memory region of the memory chip to the base chip.

Figure 8:
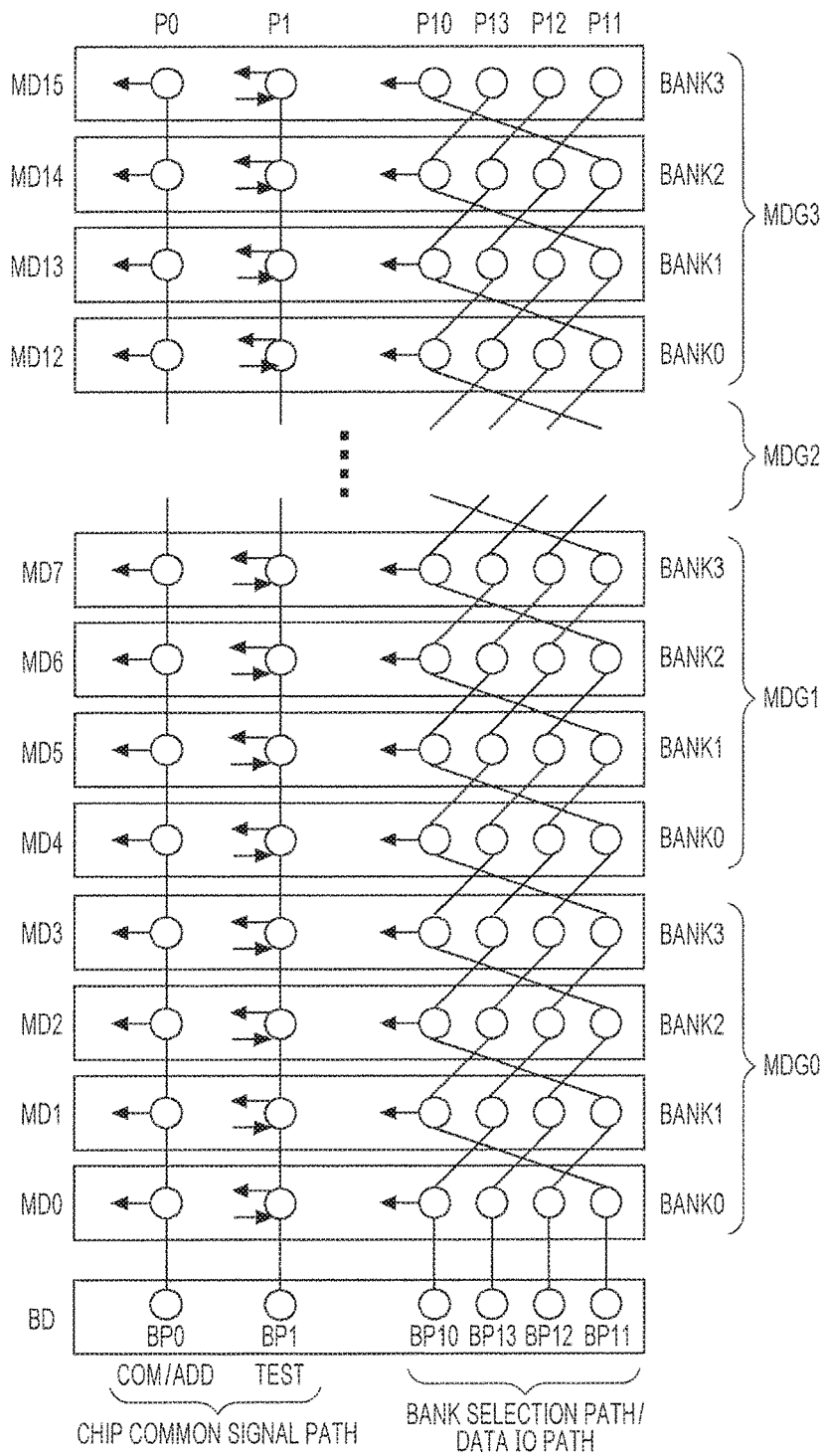
FIG. 8 is a diagram which explains signal pathways in a semiconductor device according to a comparative example.

Next, a semiconductor device as a comparative example will be described. In the comparative example, bank control-related signals for control and operation of banks are given through first through-silicon vias coupled in a specific manner as a first group and chip control-related signals for control and operation of chips are given to all chips through a common signal pathway. FIG. 8 is a diagram which explains signal pathways in the semiconductor device according to the comparative example. In FIG. 8, bank selection paths and data I/O paths are shown as bank control paths, and chip common signal paths are shown as chip control paths.

As shown in FIG. 8, in the semiconductor device according to the comparative example, the bank control paths are formed by through-silicon vias which are coupled by the same method as the first through-silicon vias of the first group in the semiconductor device according to the first embodiment. On the other hand, in the semiconductor device according to the comparative example, the chip control paths are formed by series-coupled through-silicon vias, in which through-silicon vias located at the same position in the chip stacking direction are series-coupled. A chip control-related signal is transmitted to all the stacked chips through the series-coupled through-silicon vias at a time. For the chip control paths, two types of coupling methods are adopted. A group of first series-coupled through-silicon vias give each memory chip a signal which is transmitted through a through-silicon via and bifurcated. In FIG. 8, a port comprised of the first series-coupled through-silicon vias is designated by reference sign PO and a port on the base chip which outputs a signal to the port PO is designated by reference sign BPO. A group of second series-coupled through-silicon vias transmits a signal to an overlying chip through a test path provided on a memory chip. In FIG. 8, a port comprised of the second series-coupled through-silicon vias is designated by reference sign P1 and a port on the base chip which outputs a signal to the port P1 is designated by reference sign BP1.

Figure 9:
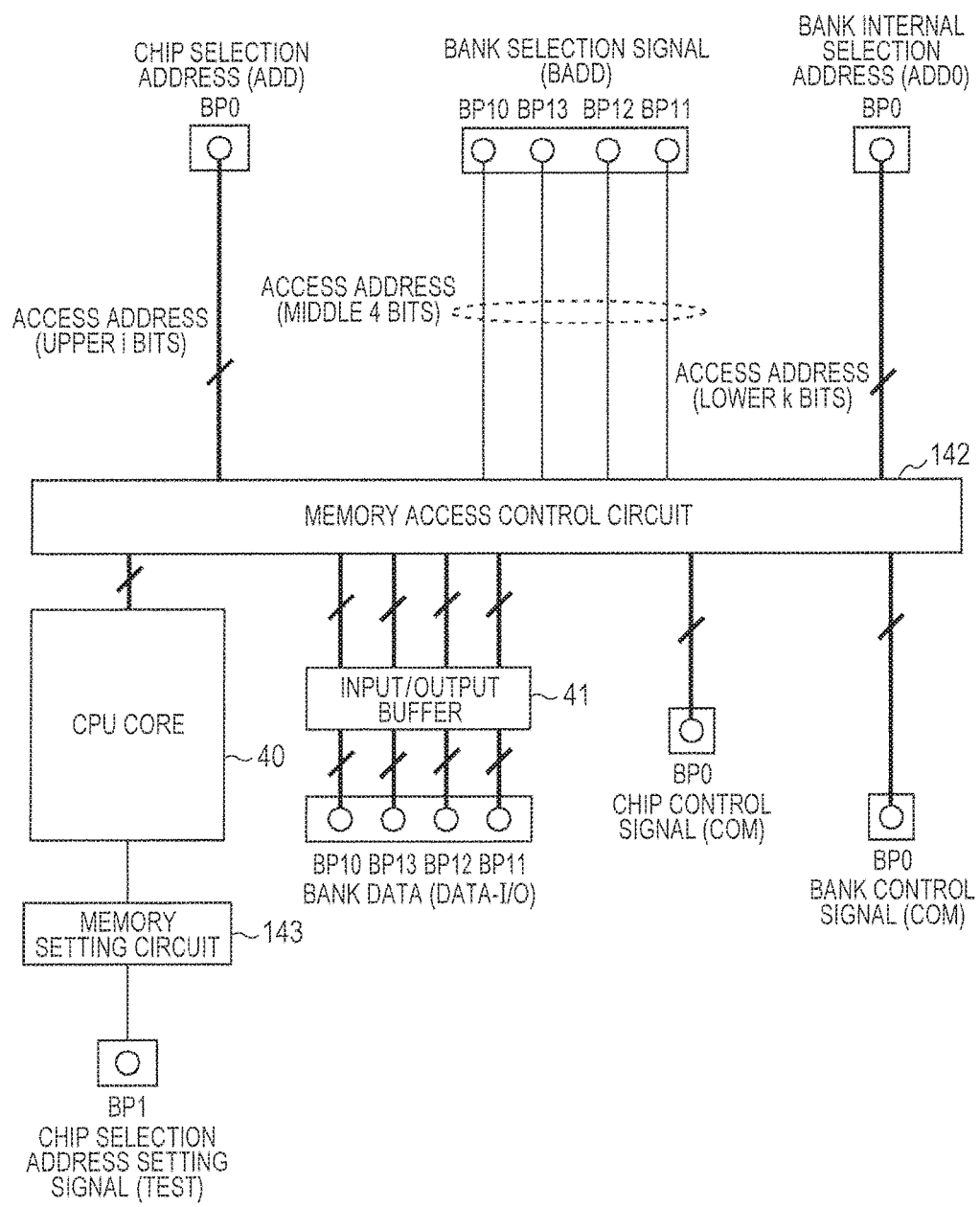
FIG. 9 is a block diagram of the base chip in the semiconductor device according to the comparative example.

FIG. 9 is a block diagram of the base chip in the semiconductor device according to the comparative example. As shown in FIG. 9, the base chip in the semiconductor device according to the comparative example includes a CPU core 40, an input/output buffer 41, a memory access control circuit 142, and a memory setting circuit 143. The CPU core 40 and the input/output buffer 41 are the same as in the base chip according to the first embodiment. In the example shown in FIG. 9 as well, data input and output between the CPU core 40 and the input/output buffer 41 are performed through the memory access control circuit 142. Like the memory access control circuit 42, the memory access control circuit 142 generates a specific operation command and address information to be given to a memory chip, from an access command given by the CPU core 40, and gives the generated operation command and address information to the memory chip. However, the address information and operation command generated by the memory access control circuit 142 are different from those generated by the memory access control circuit 42. Specifically, the memory access control circuit 142 outputs the upper i bits of the access address to be a chip selection address and the lower k bits of the access address to be a bank internal selection address, to one port (for example, port BPO). Also, the memory access control circuit 142 generates not only a bank control signal but also a chip control signal containing a command indicating the number of the chip to be activated. The chip control signal is given to the memory chip through the port BPO. The memory setting circuit 143 outputs a chip selection address setting signal for setting a chip number and a chip selection address which are different from one chip to another. The chip selection address setting signal is given to the memory chip through the port BP1.

Figure 10:
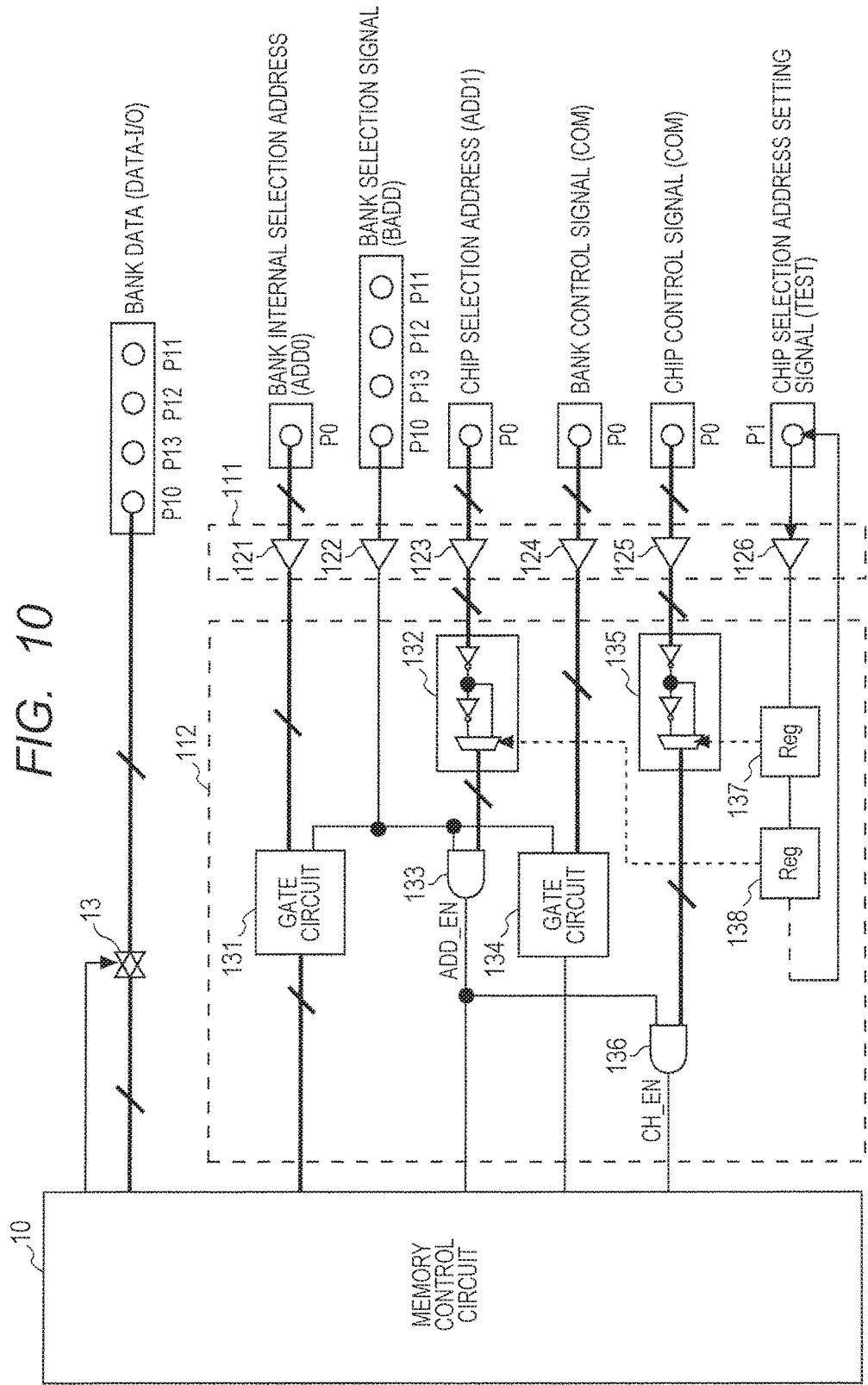
FIG. 10 is a block diagram which explains the chip selection circuit of a memory chip in the semiconductor device according to the comparative example.

FIG. 10 is a block diagram which explains the chip selection circuit of a memory chip in the semiconductor device according to the comparative example. As shown in FIG. 10, the memory chip according to the comparative example includes a memory control circuit 10, a buffer circuit group 111, a memory selection circuit 112, and an input/output buffer 13. The memory control circuit 10 and the input/output buffer 13 are the same as in the memory chip according to the first embodiment. Among the circuits of the memory chip, FIG. 10 shows the memory control circuit 10, buffer circuit group 111, chip selection circuit 12, input/output buffer 13, and through-silicon vias related to these circuits. In FIG. 10, through-silicon vias are shown on a one-via-per-port basis and only one through-silicon via is shown for one port. However, a port to which a multi-bit signal is transmitted has several through-silicon vias.

In the example shown in FIG. 10, bank data and a bank internal selection address are given to the memory chip through the abovementioned first group of through-silicon vias, and a chip selection address, a bank internal selection address, a chip control signal, a bank control signal, and a chip selection address setting signal are given to the memory chip through the abovementioned series-coupled through-silicon vias.

In the example shown in FIG. 10, the buffer circuit group 111 transmits the signal given through through-silicon vias, to the chip selection circuit 112. The buffer circuit group 111 includes buffer circuits 121 to 126 which correspond to different types of transmitted signals. The chip selection circuit 112 includes gate circuits 131 and 134, an address determination circuit 132, AND circuits 133 and 136, a chip control value determination circuit 135, and registers 137 and 138. The registers 137 and 138, which are among daisy-chained registers, store a chip selection address setting signal. The chip selection address setting signal is entered through the through-silicon via of the port P1 and returned to the port P1. The address determination circuit 132 sets the value of the chip selection address according to the value stored in the register 138, and when the set value coincides with the chip selection address, it outputs a multi-bit signal to make all the signals high. The chip control value determination circuit 135 sets the value of the bank control signal according to the value stored in the register 137, and when the set value coincides with the value indicated by the bank control signal, it outputs a multi-bit signal to make all the signals high.

The AND circuit 133 outputs an address enable signal ADD_EN which becomes high when the bank selection signal and the signals given by the address determination circuit 132 are all high. The gate circuit 131 outputs a bank internal selection address to the memory control circuit 10 in the period when the bank selection signal is high. The gate circuit 134 outputs a bank control signal to the memory control circuit 10 in the period when the bank selection signal is high. The AND circuit 136 makes the chip enable signal CH_EN high when the address enable signal ADD_EN is high and the signals given by the chip control value determination circuit 135 are all high.

In the comparative example, each memory chip cannot recognize its own position among the stacked chips unless the order in which the chips are stacked is given by a chip selection address setting signal in the process of initialization of stacked memory chips. In addition, in the semiconductor device according to the comparative example, the memory chip being accessed by the base chip cannot be activated properly unless the chip selection address and chip control signal are given to all the stacked memory chips. Thus, in the semiconductor device according to the comparative example, chip control-related signals must be given to all the memory chips through the series-coupled through-silicon vias.

The following is a comparison between the semiconductor device according to the first embodiment and the semiconductor device according to the comparative example. In the semiconductor device according to the first embodiment, a memory chip includes: n first through-silicon vias (n is an integer) which transmit a first selection signal indicating the memory bank to be activated from the base chip and penetrate the semiconductor substrate; m second through-silicon vias (m is an integer) which transmit a second selection signal indicating the memory chip to be activated from the base chip and penetrate the semiconductor substrate; a first internal wiring for shift circular coupling in which the 1st to (n−1)th first through-silicon vias of a lower chip are coupled with the 2nd to n-th first through-silicon vias of an upper chip respectively and the n-th first through-silicon via of the lower chip is coupled with the 1st first through-silicon via of the upper chip; and a second internal wiring for shift circular coupling in which the 1st to (m−1)th second through-silicon vias of the lower chip are coupled with the 2nd to m-th second through-silicon vias of the upper chip respectively and the m-th second through-silicon via of the lower chip is coupled with the 1st second through-silicon via of the upper chip. Here, n and m are set to have only one common divisor. In the semiconductor device according to the first embodiment, a plurality of memory chips which have wirings as mentioned above are stacked so that a signal is circularly transmitted to memory chips located in upper layers. In the semiconductor device according to the first embodiment, activation of the memory chips is controlled by combination of the first selection signal and the second selection signal.

In other words, the semiconductor device according to the first embodiment gives the memory chips both a chip control-related signal and a bank control-related signal through through-silicon vias coupled by the shift circular method. Furthermore, in the semiconductor device according to the first embodiment, a specific port on a memory chip is coupled with an internal circuit by an internal wiring. Consequently, in the semiconductor device according to the first embodiment, the signal sent from the specific port on the base chip is transmitted only to the memory chip located at the position corresponding to the number of cycles in shift circular coupling. For example, referring to FIG. 4, a signal sent from the port BP10 on the base chip is transmitted to memory chips through a signal pathway corresponding to 4 as the number of cycles; specifically it is transmitted only to the memory chips MD0, MD4, MD8, and MD12 which are defined as bank 0. A signal sent from the port BP20 is transmitted through a signal pathway corresponding to 5 as the number of cycles; specifically it is transmitted only to the memory chips MD0, MD5, MD10, and MD15.

Therefore, in the semiconductor device according to the first embodiment, the stacked position of each memory chip can be identified by the port number on the base chip and it is unnecessary to specify the stacked position of each memory chip by the initialization process as in the semiconductor device according to the comparative example. Furthermore, in the semiconductor device according to the first embodiment, the number of cycles m for a pathway to transmit a chip control-related signal and the number of cycles n for a pathway to transmit a bank control-related signal are set to have only one common divisor. Therefore, if the number of stacked chips is smaller than a common multiple of n and m, a specific bank on a specific chip can be specified by combination of a chip selection signal and a bank selection signal. Therefore, in the memory chips mounted in the semiconductor device according to the first embodiment, the chip selection circuit can be structurally simpler than in the memory chips mounted in the semiconductor device according to the comparative example.

Furthermore, in the semiconductor device according to the first embodiment, the pathway to transmit a chip control-related signal and the pathway to transmit a bank control-related signal both adopt the shift circular coupling method, so the parasitic capacitance of the internal circuit inherent in the pathway to transmit a chip control-related signal can also be smaller than in the semiconductor device according to the comparative example.

As apparent from the above explanation, the semiconductor device according to the first embodiment reduces the parasitic capacitance inherent in the signal transmission pathway used to control memory chips and reduces the power consumption required for transmission of signals. In the semiconductor device according to the first embodiment, by reducing the power consumption required for transmission of signals, power supply noise in the base chip and memory chips can be reduced to improve operational stability. Specifically, the reduction in power supply noise can increase the noise margin for the memory. Also, since the power consumption required for transmission of signals is reduced, the required drive capability of a transistor which outputs a signal can be smaller and thus the size of the transistor of the drive circuit can be smaller.

Furthermore, in the semiconductor device according to the first embodiment, since the parasitic capacitance inherent in the pathway to transmit signals is small, the operation speed of the semiconductor device can be increased.

Furthermore, in the semiconductor device according to the first embodiment, simply by stacking memory chips with the same internal wiring structure, a signal transmission pathway which transmits a signal circularly among the memory chips can be formed. In short, in the semiconductor device according to the first embodiment, a signal transmission pathway based on the shift circular coupling method is formed simply by stacking memory chips which are manufactured by the same manufacturing process, and thus control of memory chips is easy.

Furthermore, in the semiconductor device according to the first embodiment, in the chip selection circuit on a memory chip, a circuit which outputs a chip enable signal CH_EN is formed by only one AND circuit, so the number of circuits required for the chip selection circuit can be decreased.

Furthermore, in the semiconductor device according to the first embodiment, it is unnecessary to use a chip selection address setting signal which enables each memory chip to recognize its own stacked position in the initialization process, so the starting process can be sped up.

Second Embodiment

Figure 11:
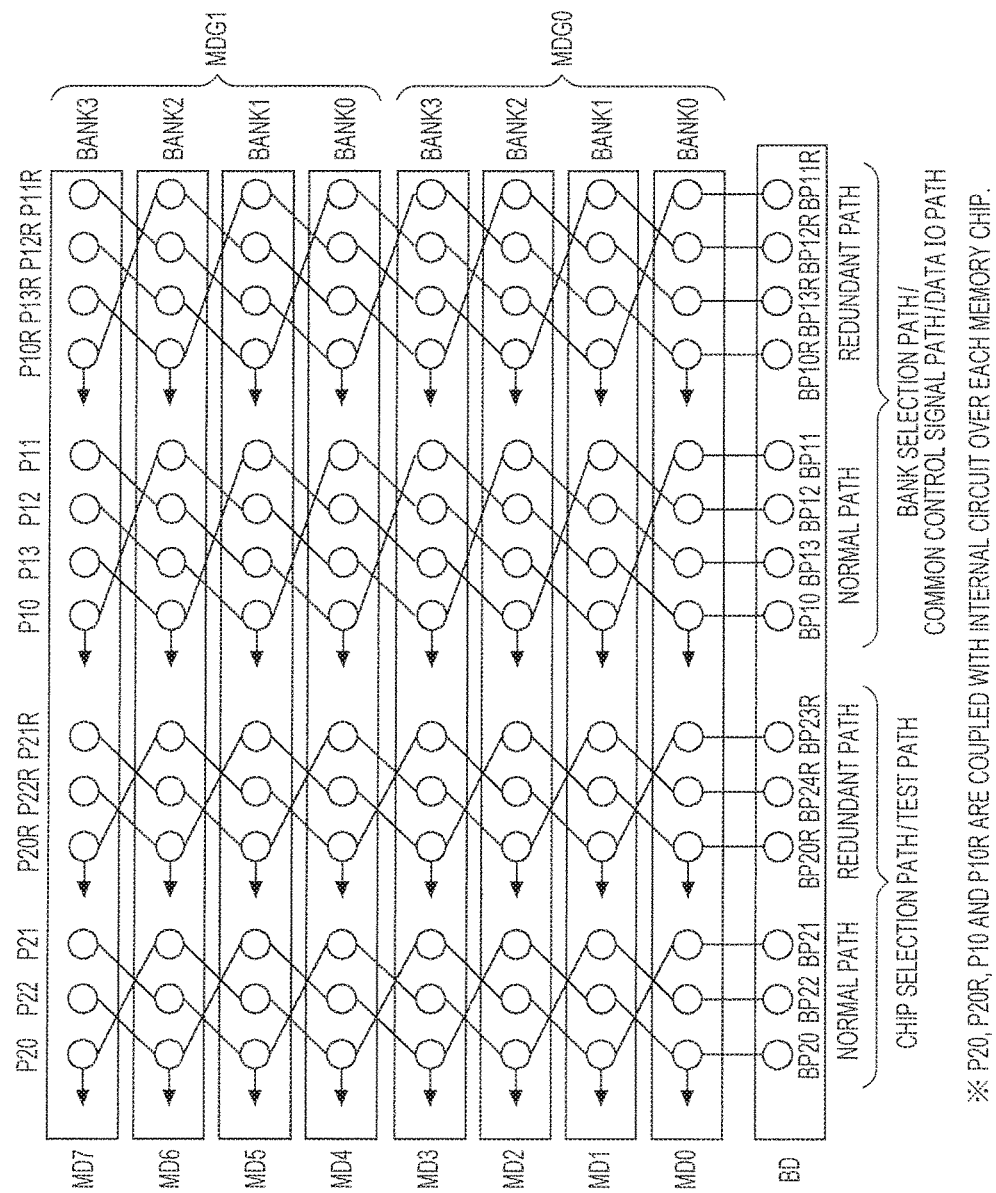
FIG. 11 is a diagram which explains signal pathways in a semiconductor device according to a second embodiment of the invention.

Next, the second embodiment of the present invention will be described. FIG. 11 is a diagram which explains signal pathways in the semiconductor device according to the second embodiment. As shown in FIG. 11, the semiconductor device according to the second embodiment includes not only normal paths which are used when the signal transmission pathways are normal, but also redundant paths which are used when trouble occurs in the signal transmission pathways used as normal paths. The redundant paths use the same coupling method as the paths to be replaced by them.

Figure 12:
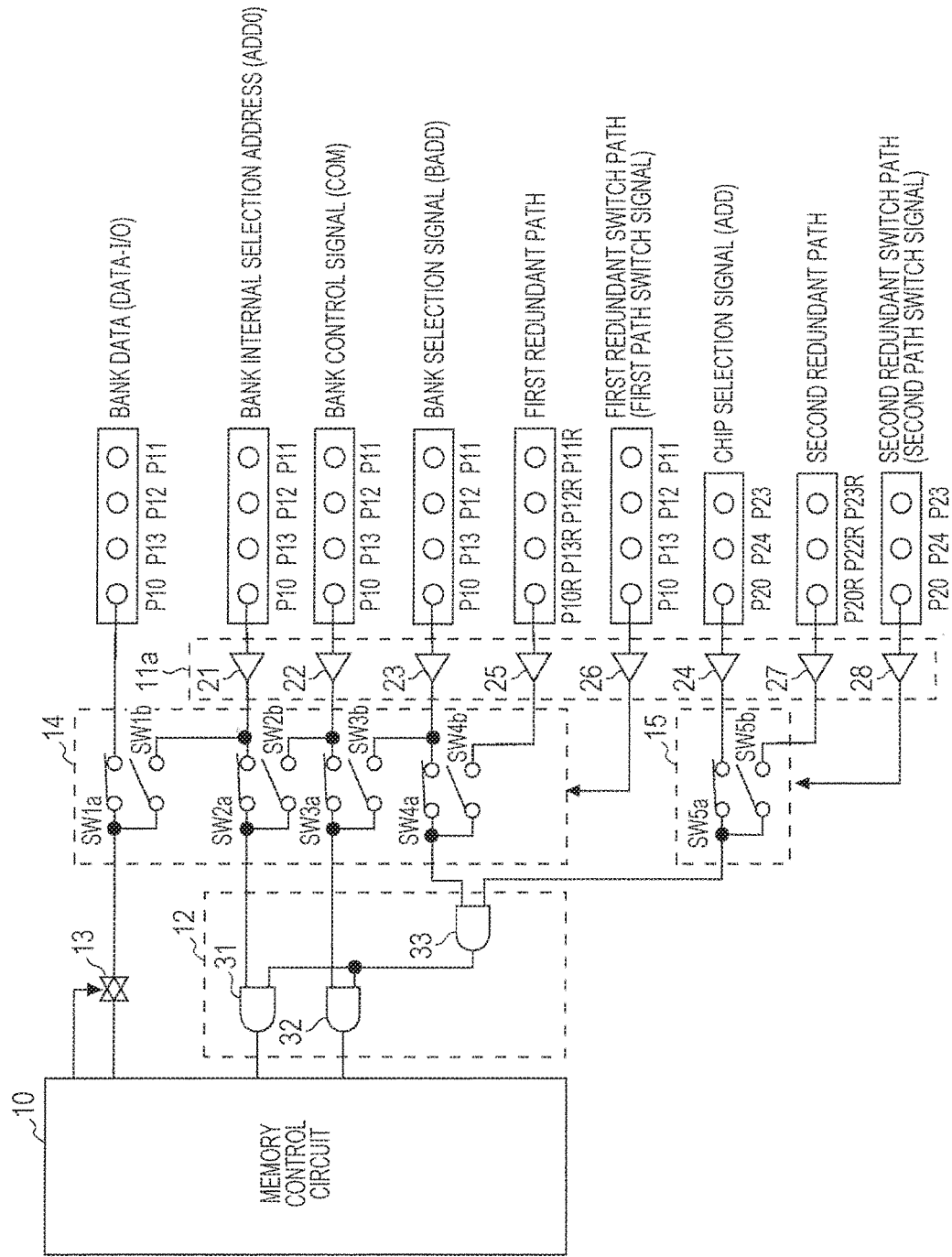
FIG. 12 is a block diagram which explains the chip selection circuit of the semiconductor device according to the second embodiment.

Next, the memory chip configuration including the redundant paths will be described. FIG. 12 is a block diagram which explains the chip selection circuit of the semiconductor device according to the second embodiment. In FIG. 12, whether the signal to be transmitted to a memory chip is a multi-bit signal or a one-bit signal is not indicated.

As shown in FIG. 12, the memory chip according to the second embodiment includes a memory control circuit 10, a chip selection circuit 12, an input/output buffer 13 and also a first path switch circuit (for example, a path switch circuit 14) and a second path switch circuit (for example, a path switch circuit 15). The memory chip according to the second embodiment also includes a buffer circuit group 11a instead of the buffer circuit group 11. The buffer circuit group 11a, which has a larger number of buffer circuits to cope with an increasing number of received signals, is substantially the same as the buffer circuit group 11. The buffer circuit group 11a includes buffer circuits 21 to 28.

In the example shown in FIG. 12, through-silicon vias which transmit bank data, a bank internal selection address, a bank control signal, and a bank selection signal are normal paths which belong to a first group and through-silicon vias which transmit a chip selection signal are normal paths which belong to a second group. The memory chip according to the second embodiment includes a first redundant path, a first redundant switch path, a second redundant path, and a second redundant switch path in addition to these normal paths.

The first redundant path configures a signal transmission pathway which has the same structure as the signal transmission pathway formed by n first through-silicon vias (for example, n=4) and a first internal wiring. The first redundant switch path configures a signal transmission pathway which has the same structure as the signal transmission pathway formed by the n first through-silicon vias and the first internal wiring, and transmits a first path switch signal. The second redundant path configures a signal transmission pathway which has the same structure as the signal transmission pathway formed by m second through-silicon vias (for example, m=3) and a second internal wiring. The second redundant switch path configures a signal transmission pathway which has the same structure as the signal transmission pathway formed by the m second through-silicon vias and the second internal wiring, and transmits a second path switch signal.

According to the first path switch signal, the path switch circuit 14 selects whether the signal transmitted through the first through-silicon vias is transmitted to an internal circuit in a memory chip (for example, the memory control circuit 10) or the signal transmitted through the first redundant path is transmitted to the internal circuit in the memory chip.

According to the second path switch signal, the path switch circuit 15 selects whether the signal transmitted through the second through-silicon vias is transmitted to the internal circuit in the memory chip or the signal transmitted through the second redundant path is transmitted to the internal circuit in the memory chip.

The path switch circuit 14 includes switches SW1a to SW4a and SW1b to SW4b. The path switch circuit 14 selects which switches among the switches SW1a to SW4a and switches SW1b to SW4b are turned on, according to the first path switch signal. For example, if a disconnection or the like occurs in the pathway which transmits a bank control signal, the path switch circuit 14 turns on the switches SW1a, SW2a, SW3b, and SW4b and off the switches SW1b, SW2b, SW3a, and SW4a, according to the first path switch signal. Then, the base chip outputs a bank control signal through the port which has been used to send a bank selection signal and sends the bank selection signal through the port corresponding to the first redundant path so that all signals are transmitted to the internal circuit in the memory chip without using the pathway in which the disconnection has occurred.

The path switch circuit 15 includes switches SW5a and SW5b. According to the second path switch signal, the path switch circuit 15 turns on the switch SW5a or switch SW5b. For example, if a disconnection or the like occurs in the pathway which transmits a chip selection signal, the path switch circuit 15 turns on the switch SW5b and off the switch SW5a, according to the second path switch signal. Then, the base chip outputs a chip selection signal through the port corresponding to the second redundant path so that the chip selection signal is transmitted to the internal circuit in the memory chip.

As apparent from the above explanation, the semiconductor device according to the second embodiment improves the reliability of the signal transmission pathways because it has redundant paths in addition to normal paths. Furthermore, in the semiconductor device according to the second embodiment, switching between a normal path and a redundant path can be made not for each through-silicon via group but for each through-silicon via in a group or for each port. Consequently, the semiconductor device according to the second embodiment provides a high redundancy capability using a smaller number of through-silicon vias.

Third Embodiment

Figure 13:
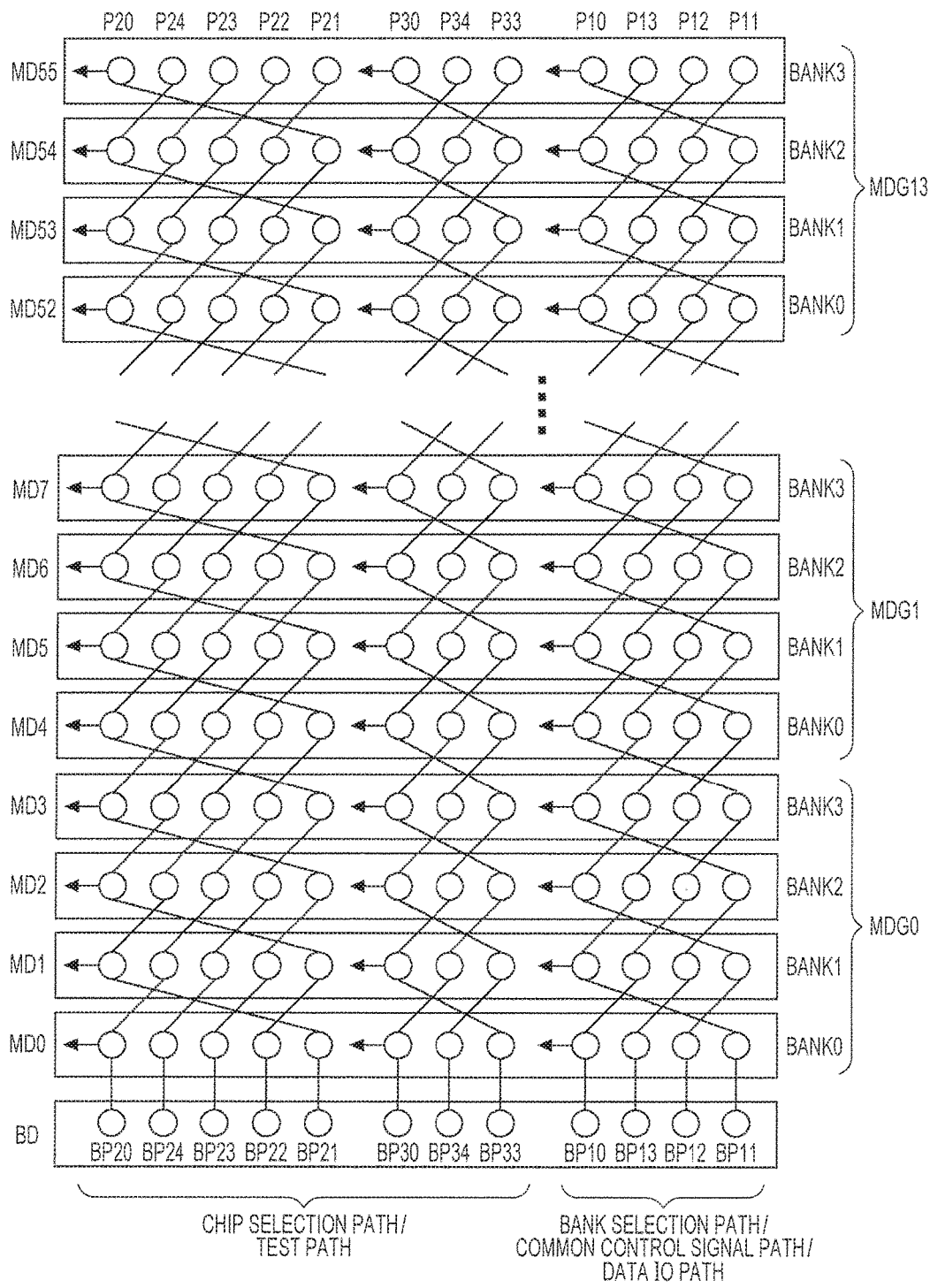
FIG. 13 is a diagram which explains signal pathways in a semiconductor device according to a third embodiment of the invention.

Next, the third embodiment of the present invention will be described. FIG. 13 is a diagram which explains signal pathways in the semiconductor device according to the third embodiment. As shown in FIG. 13, the semiconductor device according to the third embodiment provides three types of signal transmission pathways based on the shift circular coupling method, which are different in the number of cycles. Specifically, the semiconductor device according to the third embodiment includes a third through-silicon via group which has o through-silicon vias (o is an integer).

In the example shown in FIG. 13, three numbers, namely 3, 4, and 5, are used for the number of cycles. Specifically, in the semiconductor device according to the third embodiment shown in FIG. 13, a bank control-related signal is transmitted through a signal transmission pathway in which the number of cycles n is 4, and a chip control-related signal is transmitted through two signal transmission pathways: a signal transmission pathway in which the number of cycles m is 5 and a signal transmission pathway in which the number of cycles o is 3. Again, in the semiconductor device according to the third embodiment, the numbers of cycles for the signal transmission pathways are set to have only one common divisor.

In a memory chip according to the third embodiment, regarding a plurality of lower pads and a plurality of upper pads which correspond to the through-silicon vias of the third group, the 1st to (o−1)th lower pads are coupled with the 2nd to o-th upper pads and the o-th lower pad is coupled with the 1st upper pad by internal wiring.

Thus the number of memory chips which can be stacked can be increased by adding a group of through-silicon vias in a manner that the numbers of cycles have only one common divisor. For example, while the maximum number of stacked chips is 20 in the semiconductor device according to the first embodiment, the maximum number of stacked chips is 60 in the semiconductor device according to the third embodiment.

The invention made by the present inventors has been so far explained concretely in reference to the preferred embodiments thereof. However, the invention is not limited thereto and it is obvious that these details may be modified in various ways without departing from the gist thereof.

What is claimed is:
1. A semiconductor device comprising:
 a base chip having a memory control circuit to control data input and output to/from a memory region storing data; and
 a plurality of memory chips which each have a memory circuit as part of the memory region and are arranged in a manner to be stacked over the base chip,
 each of the memory chips, to which one of a plurality of memory spaces obtained by dividing the memory region for every given memory capacity is allocated, comprising:
  n first through-silicon vias (n is an integer) which transmit a first selection signal indicating one of the memory spaces to be activated, from the base chip and penetrate a semiconductor substrate;
  m second through-silicon vias (m is an integer) which transmit a second selection signal indicating one of the memory chips to be activated, from the base chip and penetrate the semiconductor substrate;
  a first internal wiring for shift circular coupling in which the 1st to (n−1)th first through-silicon vias of a lower chip are coupled with the 2nd to n-th first through-silicon vias of an upper chip respectively and the n-th first through-silicon via of the lower chip is coupled with the 1st first through-silicon via of the upper chip; and
  a second internal wiring for shift circular coupling in which the 1st to (m−1)th second through-silicon vias of the lower chip are coupled with the 2nd to m-th second through-silicon vias of the upper chip respectively and the m-th second through-silicon via of the lower chip is coupled with the 1st second through-silicon via of the upper chip,
 wherein n and m are set to have only one common divisor, and
 wherein activation of the memory chips is controlled by combination of the first selection signal and the second selection signal.
2. The semiconductor device according to claim 1, wherein n is the same as the number of the memory spaces.
3. The semiconductor device according to claim 1, wherein an access pathway to the memory spaces is formed by a signal pathway having the same structure as a signal pathway comprised of the n first through-silicon vias and the first internal wiring.

4. The semiconductor device according to claim 1, wherein each of the memory chips have a chip selection circuit which activates the memory space allocated to the chip itself when the first selection signal and the second selection signal both indicate activation.

5. The semiconductor device according to claim 1, wherein each memory chip has an internal circuit,
wherein in each memory chip, the first internal wiring transmits the first selection signal transmitted through the 1st first through-silicon via to the internal circuit, and
wherein in each memory chip, the second internal wiring transmits the second selection signal transmitted through the 1st second through-silicon via to the internal circuit.

6. The semiconductor device according to claim 1, wherein each memory chip further comprises:
a first redundant path which configures a signal transmission pathway having the same structure as a signal transmission pathway formed by the n first through-silicon vias and the first internal wiring;
a first redundant switch path which configures a signal transmission pathway having the same structure as the signal transmission pathway formed by the n first through-silicon vias and the first internal wiring, and transmits a first path switch signal;
a second redundant path which configures a signal transmission pathway having the same structure as a signal transmission pathway formed by the m second through-silicon vias and the second internal wiring;
a second redundant switch path which configures a signal transmission pathway having the same structure as the signal transmission pathway formed by the m second through-silicon vias and the second internal wiring, and transmits a second path switch signal;
a first path switch circuit which selects, according to the first path switch signal, whether a signal transmitted through the first through-silicon vias is transmitted to the internal circuit formed in the memory chip or a signal transmitted through the first redundant path is transmitted to the internal circuit; and
a second path switch circuit which selects, according to the second path switch signal, whether a signal transmitted through the second through-silicon vias is transmitted to the internal circuit formed in the memory chip or a signal transmitted through the second redundant path is transmitted to the internal circuit.

* * * * *